(12) United States Patent
Yew et al.

(10) Patent No.: US 11,742,322 B2
(45) Date of Patent: Aug. 29, 2023

(54) INTEGRATED FAN-OUT PACKAGE HAVING STRESS RELEASE STRUCTURE

(71) Applicant: Taiwan Semiconductor Manufacturing Company, Ltd., Hsinchu (TW)

(72) Inventors: Ming-Chih Yew, Hsinchu (TW); Po-Chen Lai, Hsinchu County (TW); Shu-Shen Yeh, Taoyuan (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 9 days.

(21) Appl. No.: 17/153,739

(22) Filed: Jan. 20, 2021

(65) Prior Publication Data
US 2022/0230990 A1    Jul. 21, 2022

(51) Int. Cl.
| | | |
|---|---|---|
| *H01L 25/065* | (2023.01) | |
| *H01L 23/31* | (2006.01) | |
| *H01L 23/538* | (2006.01) | |
| *H01L 21/683* | (2006.01) | |
| *H01L 21/48* | (2006.01) | |
| *H01L 21/56* | (2006.01) | |
| *H01L 25/00* | (2006.01) | |
| *H01L 23/00* | (2006.01) | |

(52) U.S. Cl.
CPC ...... *H01L 25/0652* (2013.01); *H01L 21/4853* (2013.01); *H01L 21/4857* (2013.01); *H01L 21/563* (2013.01); *H01L 21/565* (2013.01); *H01L 21/568* (2013.01); *H01L 21/6835* (2013.01); *H01L 23/3128* (2013.01); *H01L 23/3135* (2013.01); *H01L 23/5383* (2013.01); *H01L 23/5386* (2013.01); *H01L 24/08* (2013.01); *H01L 25/50* (2013.01); *H01L 2221/68372* (2013.01); *H01L 2224/08145* (2013.01); *H01L 2924/18161* (2013.01)

(58) Field of Classification Search
CPC . H01L 25/0652; H01L 25/50; H01L 21/4853; H01L 21/4857; H01L 21/563; H01L 21/565; H01L 21/568; H01L 21/6835; H01L 23/3128; H01L 23/3135; H01L 23/5383; H01L 23/5386; H01L 24/08; H01L 2221/68372; H01L 2224/08145; H01L 2924/18161
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |

(Continued)

*Primary Examiner* — Kyoung Lee
*Assistant Examiner* — Christina A Sylvia
(74) *Attorney, Agent, or Firm* — JCIPRNET

(57) ABSTRACT

A semiconductor package includes a redistribution structure, a first die, a second die and a buffer layer. The second die is disposed between the first die and the redistribution structure, and the second die is electrically connected to the first die and bonded to the redistribution structure. The buffer layer is disposed on a first sidewall of the second die, wherein a second sidewall of the buffer layer is substantially flush with a third sidewall of the first die.

20 Claims, 21 Drawing Sheets

(56) References Cited

U.S. PATENT DOCUMENTS

| | | | |
|---|---|---|---|
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 11,011,502 B2* | 5/2021 | Lee | H01L 21/568 |
| 2010/0258933 A1* | 10/2010 | Fujishima | H01L 21/566 |
| | | | 257/E23.145 |
| 2011/0057327 A1* | 3/2011 | Yoshida | H01L 23/544 |
| | | | 257/777 |
| 2012/0070939 A1* | 3/2012 | Dunne | H01L 21/563 |
| | | | 257/E21.705 |
| 2013/0175686 A1* | 7/2013 | Meyer | H01L 24/14 |
| | | | 257/737 |
| 2016/0071810 A1* | 3/2016 | Park | H01L 23/552 |
| | | | 257/723 |
| 2019/0043819 A1* | 2/2019 | Ho | H01L 23/3135 |
| 2019/0067104 A1* | 2/2019 | Huang | H01L 24/16 |
| 2019/0229091 A1* | 7/2019 | Kim | H01L 24/17 |
| 2019/0244946 A1* | 8/2019 | Kim | H01L 23/552 |
| 2019/0244947 A1* | 8/2019 | Yu | H01L 25/0657 |
| 2020/0006178 A1 | 1/2020 | Huang et al. | |
| 2020/0058618 A1* | 2/2020 | Hsieh | H01L 24/01 |
| 2020/0135670 A1* | 4/2020 | Hsu | H01Q 1/2283 |
| 2020/0152602 A1 | 5/2020 | Wei et al. | |
| 2020/0335544 A1* | 10/2020 | Hsieh | H01L 23/3128 |
| 2020/0365571 A1 | 11/2020 | Chen et al. | |

* cited by examiner

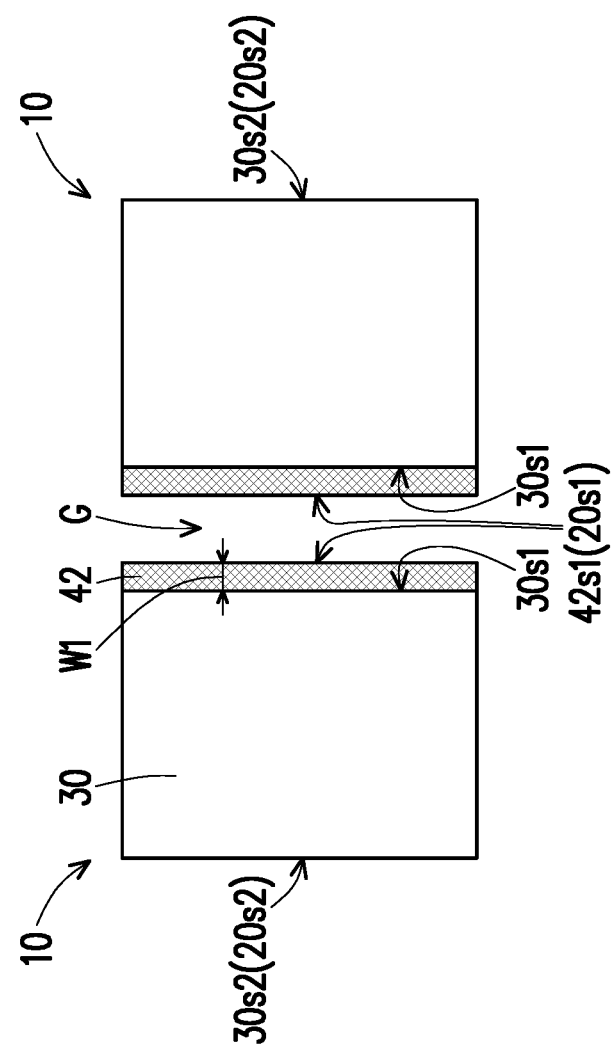

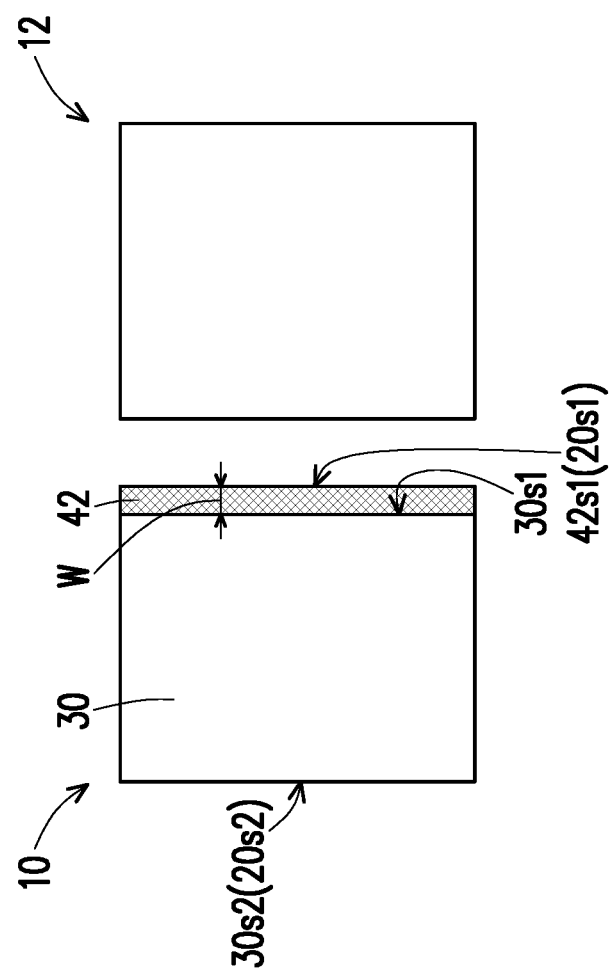

INTEGRATED FAN-OUT PACKAGE HAVING STRESS RELEASE STRUCTURE

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components may require smaller packages that utilize less area than previous packages. Currently, integrated fan-out packages are becoming increasingly popular for their compactness. How to ensure the reliability of the integrated fan-out packages has become a challenge in the field.

BRIEF DESCRIPTION OF THE DRAWINGS

FIGS. 5A and 5B are schematic cross-sectional view and top view of a semiconductor package in accordance with some embodiments.

FIGS. 9A and 9B are schematic cross-sectional view and top view of a semiconductor package in accordance with some embodiments.

DETAILED DESCRIPTION

Figure 1A:
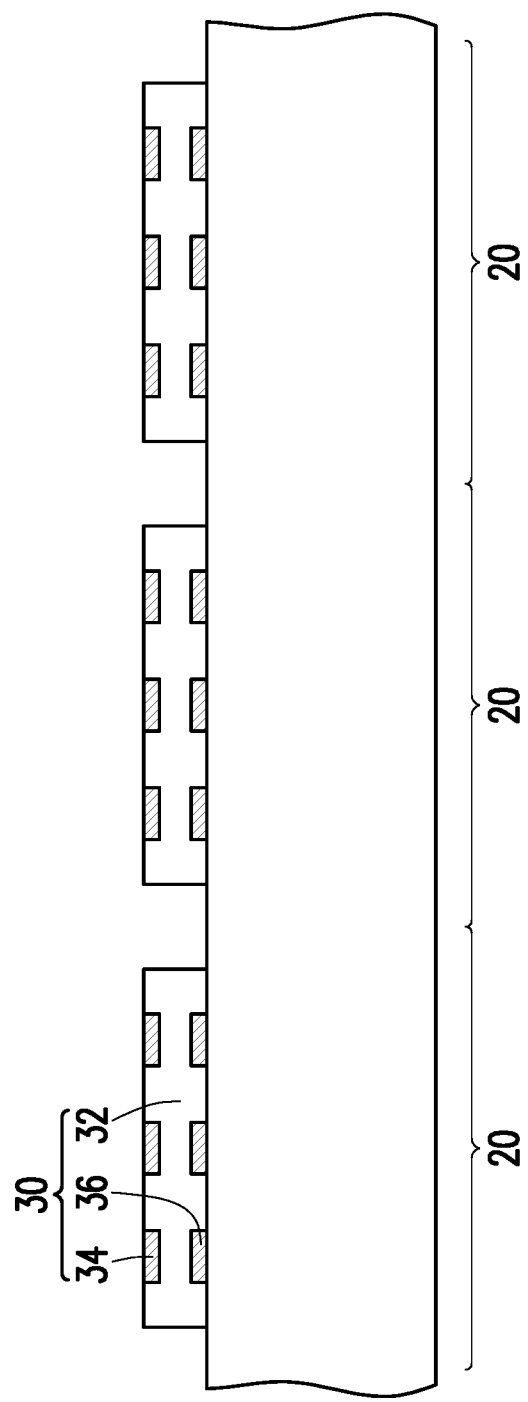
FIG. 1A to FIG. 1C are schematic cross-sectional views of various stages in a method of forming a die according to some embodiments.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
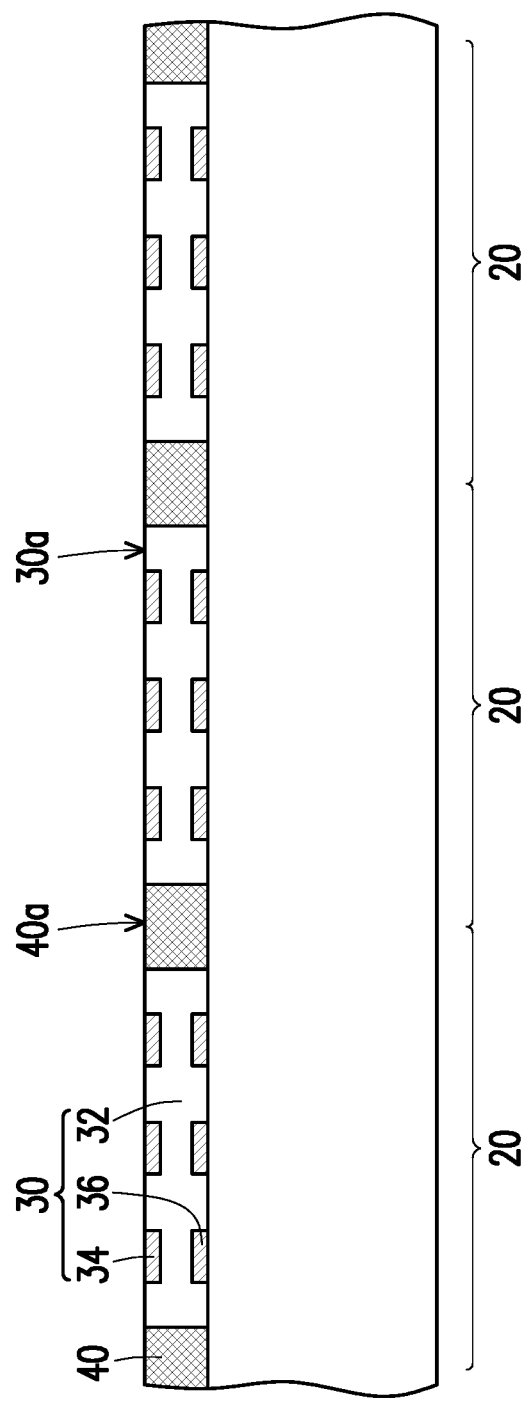
Figure 1C:
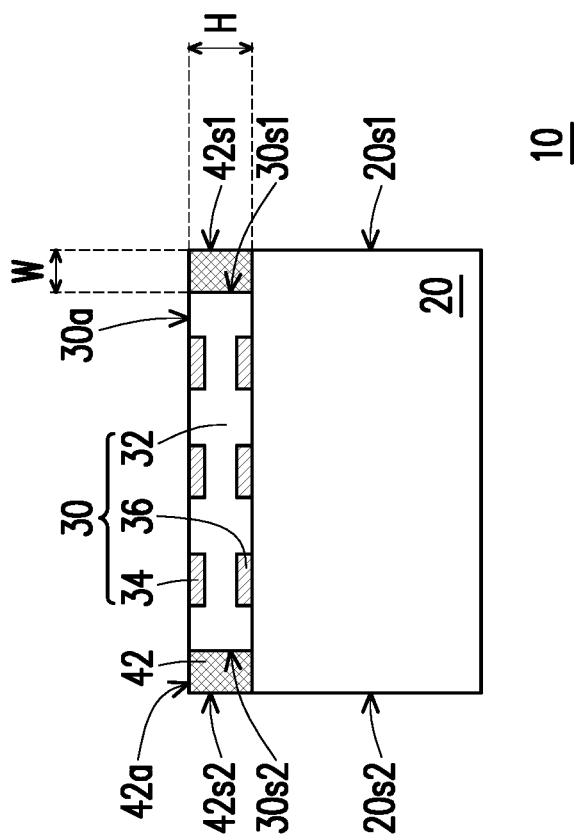

The buffer layer (stress release structure) may ensure good structural integrity especially in large interposer package. By forming one or more buffer layer adjacent to the gap between the packages, the stress due to the CTE mismatch between the package substrate and the die may be released. FIG. 1A to FIG. 1C are schematic cross-sectional views of various stages in a method of forming a die according to some embodiments.

Referring to FIG. 1A, a plurality of dies 20 are provided. In some embodiments, a wafer including any number of dies 20 is provided. In some embodiments, the dies 20 are separated by scribe line regions (not shown) therebetween. In some embodiments, the dies 20 have the same size (e.g., same height and/or surface area). In alternative embodiments, the dies 20 have different sizes (e.g., different heights and/or surface areas). The die 20 includes a substrate. The substrate may be a bulk semiconductor substrate, a semiconductor-on-insulator (SOI) substrate, or the like. The semiconductor material of the substrate may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate may be doped or undoped. The substrate may include a wide variety of active devices (not shown) and passive devices (not shown) such as capacitors, resistors, inductors and the like that may be used to generate the desired structural and functional design for the die 20. The active devices and passive devices may be formed using any suitable methods either within or else on an active surface of the substrate. In embodiments where the die 20 is a functional die, the die 20 includes active devices. In embodiments where the die 20 is an interposer, the die 20 includes passive devices or devices may be omitted, such that the die 20 is free of active devices. The die 20 may further include an interconnect structure (not shown) and bond pads (not shown) electrically connected to the interconnect structure. The interconnect structure may include one or more dielectric layers and respective conductive patterns formed on the active surface. The conductive patterns in the dielectric layers may route electrical signals between the devices, such as by using vias and/or traces, and may also contain various electrical devices, such as capacitors, resistors, inductors, or the like. The various devices and conductive patterns may be interconnected to perform one or more functions. The functions include memory structures, processing structures, sensors, amplifiers, power distribution, input/output circuitry, or the like.

In some embodiments, the die 20 further includes a plurality of electrical connectors (not shown) formed and electrically connected to the bond pads to provide an external electrical connection to the circuitry and devices. In some embodiments, the electrical connectors are utilized when bonding the die 20 to other structures. In some embodiments, the electrical connectors are solder balls and/or bumps, such as electroless nickel immersion Gold (ENIG), electroless nickel electroless palladium immersion gold (ENEPIG) technique formed bumps, or the like. In such embodiments, the bump electrical connectors include a conductive material such as solder, copper, aluminum, gold, nickel, silver, palladium, tin, the like, or a combination thereof. In an embodiment, the electrical connectors are formed by initially forming a layer of solder through suitable methods such as evaporation, electroplating, printing, solder transfer, ball placement, or the like. Once the layer of solder has been formed on the structure, a reflow may be performed in order to shape the material into the desired bump shapes.

In alternative embodiments, the electrical connectors include a conductive pillar with a conductive cap layer, which may be a solder cap, over the conductive pillar. The electrical connectors including the conductive pillar and the conductive cap layer are sometimes referred to as μbumps. In some embodiments, the conductive pillars include a conductive material such as copper, aluminum, gold, nickel, palladium, the like, or a combination thereof and is formed by sputtering, printing, electro-plating, electroless plating, chemical vapor deposition (CVD), or the like. The conductive pillars may be solder free and have substantially vertical sidewalls. In some embodiments, the conductive cap layer is formed on the top of the conductive pillar. The conductive cap layer may include nickel, tin, tin-lead, gold, copper, silver, palladium, indium, nickel-palladium-gold, nickel-gold, the like, or a combination thereof and may be formed by a plating process. One of ordinary skill in the art will appreciate that the above examples are provided for illustrative purposes. Other circuitry may be used as appropriate for a given application.

Said die 20 may be an integrated device, such as the system on a chip (SoC) structure, which includes two or more chips inside. The die 20 may have a single function (e.g., a logic device, a memory die, etc.), or may have multiple functions (e.g., a SoC, an application-specific integrated circuit (ASIC), etc.). The die 20 may be a logic die (e.g., a central processing unit, a graphics processing unit, a system-on-a-chip, a field-programmable gate array (FPGA), a microcontroller, or the like), a memory die (e.g., a dynamic random access memory (DRAM) die, a static random access memory (SRAM) die, or the like), a power management die (e.g., a power management integrated circuit (PMIC) die), a radio frequency (RF) die, a sensor die, a micro-electro-mechanical-system (MEMS) die, a signal processing die (e.g., digital signal processing (DSP) die), a front-end die (e.g., an analog front-end (AFE) die), the like, or a combination thereof.

Then, a plurality of dies 30 are stacked on and bonded to the dies 20 respectively. The die 30 has a size smaller than the die 20. In some embodiments, the dies 30 have the same size (e.g., same height and/or surface area), and in other embodiments, the dies 30 have different sizes (e.g., different heights and/or surface areas). In some embodiments, the die 30 includes a substrate 32 and a plurality of electrical connectors 34, 36 at opposite sides of the substrate 32. The die 30 may further include an interconnect structure (not shown) and bond pads (not shown) electrically connected to the interconnect structure. The substrate 32, the electrical connectors 34, 36, the interconnect structure and the bond pads of the die 30 may be the same as or similar to the substrate, the electrical connectors, the interconnect structure and the bond pads of the die 20, and thus are not iterated herein. In some embodiments, the die 30 is bonded to the die 20 through the electrical connectors 34. However, the disclosure is not limited thereto. In alternative embodiments, the die 30 is stacked on and adhered to the die 20 through an adhesive layer such as a die attach film (DAF).

The die 30 may have the same or similar function as the die 20 or different function from the die 20. Said die 30 may be an integrated device, such as the SoC structure, which includes two or more chips inside. The die 30 may have a single function (e.g., a logic device, a memory die, etc.), or may have multiple functions (e.g., a SoC, an ASIC, etc.). The die 30 may be a logic die (e.g., a central processing unit, a graphics processing unit, a system-on-a-chip, a FPGA, a microcontroller, or the like), a memory die (e.g., a DRAM die, a SRAM die, or the like), a power management die (e.g., a PMIC die), a RF die, a sensor die, a MEMS die, a signal processing die (e.g., DSP die), a front-end die (e.g., an AFE die), the like, or a combination thereof. In an embodiment, the die 20 and the die 30 are both SoCs. In another embodiment, the die 20 is a substrate without active devices, such as a silicon substrate, and the die 30 is a SoC.

Referring to FIG. 1B, a buffer material 40 is formed between the dies 30 over the dies 20. In some embodiments, the buffer material 40 is formed by filling up gaps between the dies 30 and covering surfaces 30a of the dies 30, and then being planarized until the surfaces 30a of the dies 30 are exposed. In such embodiments, a surface 40a of the buffer material 40 is substantially coplanar with the surfaces 30a of the dies 30. The buffer material 40 may be softer than the substrate of the die 20 and/or the substrate 32 of the die 30. For example, the Young's modulus of the buffer material 40 is smaller than the Young's modulus of the substrate of the die 20 and/or the substrate 32 of the die 30. For example, the Young's modulus of the buffer material 40 is smaller than the Young's modulus of silicon (i.e., 140 GPa). In some embodiments, the Young's modulus of the buffer material 40 is in a range of 200 MPa to 100 GPa. The coefficient of thermal expansion (CTE) of the buffer material 40 may be in a range of 0 ppm/° C. to 100 ppm/, and the CTE of the dies 20, 30 may be about 3 ppm/° C. The buffer material 40 may include polymer such as molding compound, underfill, or other epoxy based material, silicon oxide, solder material or the like.

Figure 3:
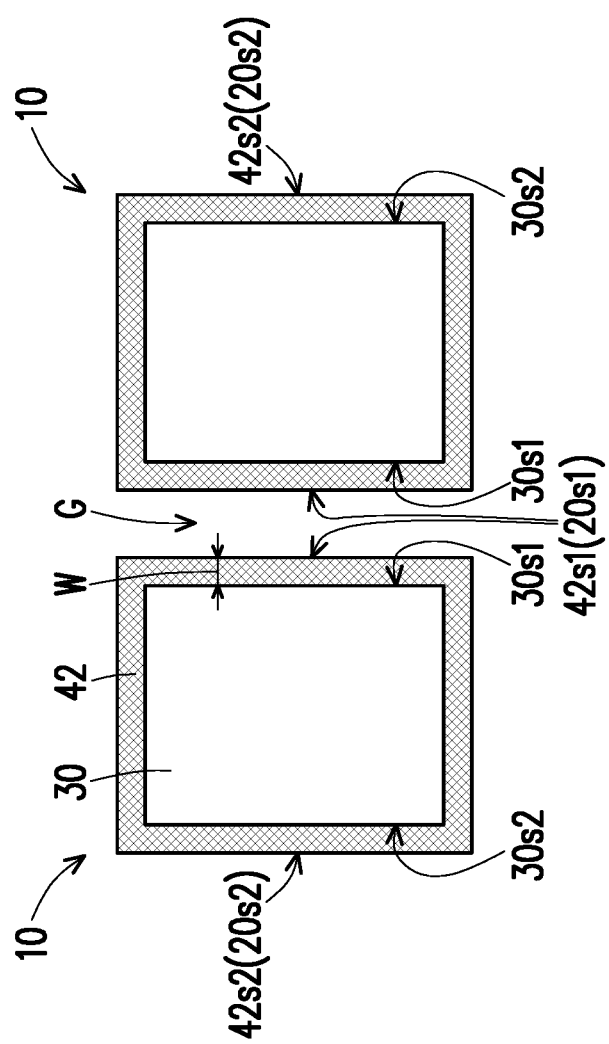
FIG. 3 is a schematic top view of a semiconductor package in accordance with some embodiments.

Referring to FIG. 1C, the structure of FIG. 1B is singulated into individual packages 10. The singulation process may include sawing, dicing, or the like. In some embodiments, during the singulation process, the buffer material 40 and the wafer are cut along the scribe line regions between the dies 20, so as to form a plurality of packages 10. In some embodiments, the package 10 includes the die 20, the die 30 stacked on the die 20 and a buffer layer 42 aside the die 30 over the die 20. The buffer layer 42 is formed by cutting the buffer material 40, and the buffer layer 42 is at least disposed at a side of the die 30. In some embodiments, the buffer layer 42 may be disposed at opposite sidewalls 30s1, 30s2 of the die 30. For example, as shown in FIG. 3, the buffer layer 42 has a ring-shaped pattern surrounding all sidewalls of the die 30 entirely. In other words, the buffer layer 42 may be disposed at four sides of the die 30. In alternative embodiments, the buffer layer 42 is disposed at one, two, three or four sides of the die 30. In addition, the buffer layer 42 may be disposed at a portion of the side. In some embodiments, opposite sidewalls 42s1, 42s2 of the buffer layer 42 are substantially flush with opposite sidewalls 20s1, 20s2 of the die 20. In some embodiments, a surface 42a of the buffer layer 42 is substantially coplanar with the surface 30a of the die 30. The buffer layer 42 has a width W and a height H. The width W may be in a range of 20 μm to 5 mm. The height H may be in a range of 10 μm to 200 μm. In some embodiments, the width W of the buffer layer 42 on the die 30 is substantially the same. That is, the width W of the buffer layer 42 on different portions of the die 30 may be substantially the same. However, the disclosure is not limited thereto. In an embodiment (not shown), the width W of the buffer layer 42 on different sidewalls of the die 30 is different. For example, the width W of the buffer layer 42 on the sidewall 30s1 of the die 30 is different from the width W of the buffer layer 42 on the sidewall 30s2 of the die 30. In an embodiment (not shown), the width W of the buffer layer 42 on the same sidewall of the die 30 is different. That is, the buffer layer 42 may have an irregular sidewall 42s1, 42s2. In some embodiments, the height H of the buffer layer 42 on different sidewalls of the die 30 is substantially the same. The height H of the buffer layer 42 may be substantially the same as a height of the die 30. In alternative embodiments, the height H of the buffer layer 42 on different portions of the die 30 is different. The buffer layer 42 may be in direct contact with the die 20 and the die 30. In alternative embodiments, if a portion of the buffer layer 42 is filled into a gap (if present) between the die 20 and the die 30, the buffer layer 42 is partially disposed between the die 20 and the die 30. In addition, the buffer layer 42 may be in direct contact with and/or surrounds components such as electrical connectors (e.g., the electrical connectors 34) at the gap. In some embodiments, the buffer layer 42 is also referred to as a stress-release layer, a stress-buffer layer, a side layer or a stress-barrier layer.

Figure 2A:
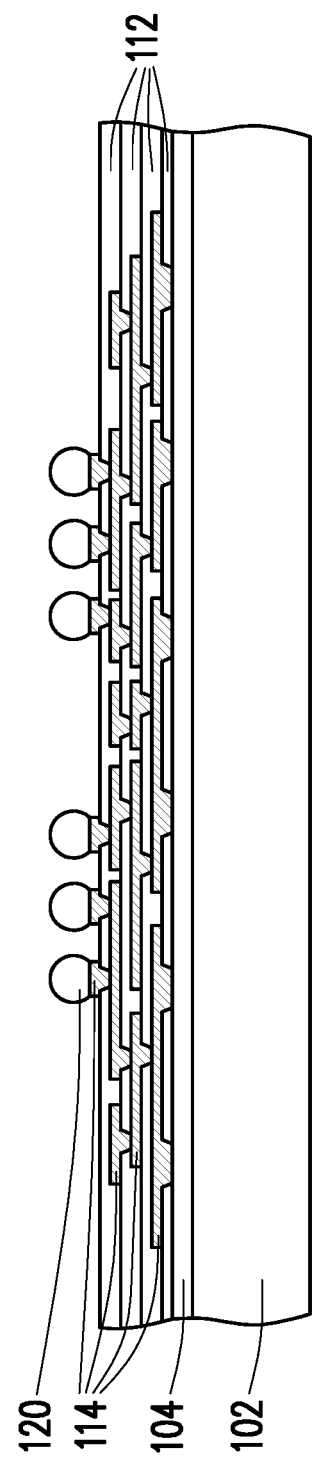
FIG. 2A to FIG. 2E are schematic cross-sectional views of various stages in a method of manufacturing a semiconductor package according to some embodiments.

FIG. 2A to FIG. 2E are schematic cross-sectional views of various stages in a method of manufacturing a semiconductor package according to some embodiments. FIG. 3 is a schematic top view of a semiconductor package in accordance with some embodiments. For simplicity and clarity of illustration, only few elements are shown in the top view of FIG. 3. Referring to FIG. 2A, a carrier 102 having a de-bonding layer 104 thereon is provided. In some embodiments, the de-bonding layer 104 is formed on a top surface of the carrier 102. For example, the carrier 102 is a glass substrate and the de-bonding layer 104 is a light-to-heat conversion (LTHC) release layer formed on the glass substrate. However, the disclosure is not limited thereto, and other suitable materials may be adapted for the carrier 102 and the de-bonding layer 104. In alternative embodiments, a buffer layer (not shown) is coated on the de-bonding layer 104, where the de-bonding layer 104 is sandwiched between the buffer layer and the carrier 102, and a top surface of the buffer layer further provides a high degree of coplanarity. The buffer layer may be a dielectric material layer or a polymer layer which is made of polyimide, BCB, PBO, or any other suitable polymer-based dielectric material.

Then, a redistribution structure 110 is formed over the carrier 102. The redistribution structure 110 is formed on the top surface of the carrier 102, and is used to electrically connect the integrated circuit devices, if any and/or to external devices. The redistribution structure 110 may include one or more dielectric layers 112 and respective conductive patterns 114 in the dielectric layers 112. The conductive patterns 114 may include vias and/or traces to interconnect any devices and/or to an external device. The conductive patterns 114 are sometimes referred to as redistribution lines. The dielectric layers 112 may include silicon oxide, silicon nitride, silicon carbide, silicon oxynitride, low-K dielectric material, such as phosphosilicate glass (PSG), boro-phosphosilicate glass (BPSG), fluoride silicate glass (FSG), $SiO_xC_y$, Spin-On-Glass, Spin-On-Polymers, silicon carbon material, compounds thereof, composites thereof, combinations thereof, or the like. The dielectric layers 112 may be deposited by any suitable method known in the art, such as spinning, CVD, plasma enhanced CVD (PECVD), high density plasma-CVD (HDP-CVD), or the like. In some embodiments, the redistribution structure 110 is also referred to as an interposer such as an organic interposer if the dielectric layers 112 includes organic materials. The conductive pattern 114 may be formed in the dielectric layer 112, by using photolithography techniques to deposit and pattern a photoresist material on the dielectric layer 112 to expose portions of the dielectric layer 112 that are to become the conductive pattern 114. An etch process, such as an anisotropic dry etch process, may be used to create recesses and/or openings in the dielectric layer 112 corresponding to the exposed portions of the dielectric layer 112. The recesses and/or openings may be lined with a diffusion barrier layer and filled with a conductive material. The diffusion barrier layer may include one or more layers of TaN, Ta, TiN, Ti, CoW, or the like, deposited by atomic layer deposition (ALD), or the like, and the conductive material may include copper, aluminum, tungsten, silver, and combinations thereof, or the like, deposited by CVD, physical vapor deposition (PVD), a plating process, or the like. Any excessive diffusion barrier layer and/or conductive material on the dielectric layer 112 may be removed, such as by using a CMP.

In some embodiments, the topmost conductive patterns 114 are conductive pads such as under bump metallurgies (UBMs). The conductive pads may be formed in openings of the topmost dielectric layers 112 of the redistribution structure 110, and the conductive pads may extend through the openings of the dielectric layer 112 of the redistribution structure 110 and extend across a top surface of the redistribution structure 110. In some embodiments, a seed layer (not shown) is formed at least in the opening in the topmost dielectric layer 112 of the redistribution structure 110. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist may be then formed and patterned on the seed layer. The photoresist may be formed by spin coating or the like and may be exposed to light for patterning. The pattern of the photoresist corresponds to the conductive pads. During the patterning process, openings are formed in the photoresist to expose the seed layer. A conductive material is formed in the openings of the photoresist and on the exposed portions of the seed layer. The conductive material may be formed by plating, such as electroplating or electroless plating, or the like. The conductive material may include a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pads.

Then, electrical connectors 120 are formed at the top surface of the redistribution structure 110 on the topmost conductive patterns 114. In some embodiments, the electrical connectors 120 include a conductive pillar with a conductive cap layer, which may be a solder cap, over the conductive pillar. The electrical connectors 120 including the conductive pillar and the conductive cap layer are sometimes referred to as μbumps. In some embodiments, the conductive pillars include a conductive material such as copper, aluminum, gold, nickel, palladium, the like, or a combination thereof and is formed by sputtering, printing, electro-plating, electroless plating, CVD, or the like. The conductive pillars may be solder free and have substantially vertical sidewalls. In some embodiments, the conductive cap layer is formed on the top of the conductive pillar. The conductive cap layer may include nickel, tin, tin-lead, gold, copper, silver, palladium, indium, nickel-palladium-gold, nickel-gold, the like, or a combination thereof and may be formed by a plating process.

In alternative embodiments, the electrical connectors 120 do not include the metal pillars and are solder balls and/or bumps, such as electroless nickel immersion Gold (ENIG), electroless nickel electroless palladium immersion gold technique (ENEPIG) formed bumps, or the like. In such embodiments, the bump electrical connectors 120 include a conductive material such as solder, copper, aluminum, gold, nickel, silver, palladium, tin, the like, or a combination thereof. In an embodiment, the electrical connectors 120 are formed by initially forming a layer of solder through suitable methods such as evaporation, electroplating, printing, solder transfer, ball placement, or the like. Once the layer of solder has been formed on the structure, a reflow may be performed in order to shape the material into the desired bump shapes.

Figure 2B:
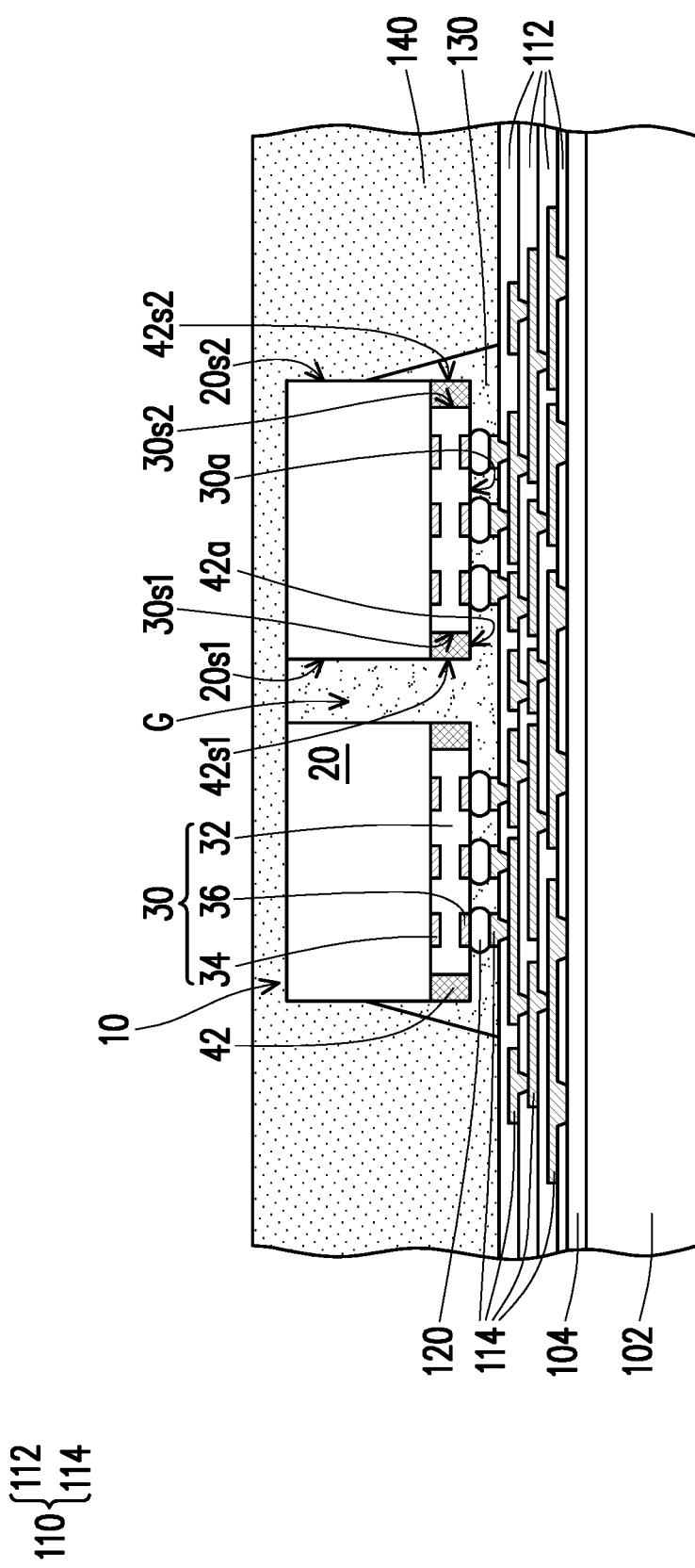

Referring to FIG. 2B, a plurality of packages 10 of FIG. 1C are bonded to the redistribution structure 110. In some embodiments, the packages 10 are placed on the redistribution structure 110 using a pick-and-place tool. The packages 10 may be bonded to the redistribution structure 110 through the electrical connectors 36. For example, the electrical connectors 36 and the electrical connectors 120 form joints between the redistribution structure 110 and the packages 10, and thus electrically connect the redistribution structure 110 to the packages 10. The packages 10 are disposed adjacent to one another, and a gap G is formed between the packages 10. In some embodiments, the packages 10 have the buffer layers 42 at its sidewall respectively. In some embodiments, portions of the buffer layers 42 of the packages 10 are facing to each other. For example, the portion of the buffer layer 42 on the sidewall $30s1$ of the die 30 in one package 10 is facing to the portion of the buffer layer 42 on the sidewall $30s1$ of the die 30 in the adjacent package 10. In some embodiments, the buffer layers 42 are disposed adjacent to the gap G between the packages 10. In other words, the gap G may be disposed between the buffer layers 42 of adjacent packages 10. In some embodiments, the gap G is also referred to as a die to die gap.

Then, an underfill 130 may be formed between the packages 10 and the redistribution structure 110. In some embodiments, the underfill 130 surrounds the electrical connectors 120 between the packages 10 and the redistribution structure 110. The underfill 130 may be formed by a capillary flow process after the packages 10 are attached to the redistribution structure 110. In some embodiments, the material of the underfill 130 is different from the material of the buffer layer 42. In some embodiments, an interface is formed between the underfill 130 and the buffer layer 42. In some embodiments, a top surface of the underfill 130 between the packages 10 is substantially flush with top surfaces of the packages 10. That is, the underfill 130 fills up the gap G between the packages 10, for example. The underfill 130 may be disposed between and in direct contact with the buffer layers 42. In some embodiments, the underfill 130 is disposed at the sidewalls $42s1$, $42s2$ and the surfaces $42a$ of the buffer layers 42. The underfill 130 may surround the buffer layer 42 and the die 20. However, the disclosure is not limited thereto. In alternative embodiments (not shown), the top surface of the underfill 130 between the packages 10 is lower than the top surfaces of the packages 10. In an embodiment (not shown), the top surface of the underfill 130 between the packages 10 is lower than a top surface (i.e., a surface opposite to the surface $42a$) of the buffer layer 42. In such embodiment, only a portion (e.g., a lower portion) of the sidewall $42s1$ of the buffer layer 42 is in direct contact with the underfill 130. Similarly, the sidewall $42s2$ of the buffer layer 42 may be partially in direct contact with the underfill 130.

After forming the underfill 130, an encapsulant 140 is formed over the redistribution structure 110, the packages 10 and the underfill 130. The encapsulant 140 may be a molding compound, epoxy, or the like, and may be applied by compression molding, transfer molding, or the like. The encapsulant 140 may be formed over the redistribution structure 110 such that the packages 10 are buried or covered. The encapsulant 140 is then cured. In some embodiments, the material of the encapsulant 140 is different from the material of the buffer layer 42. In alternative embodiments, the encapsulant 140 fills up the gap G between the packages 10. In such embodiments, the encapsulant 140 is in direct contact with the buffer layer 42, and an interface is formed between the buffer layer 42 and the encapsulant 140.

Figure 2C:
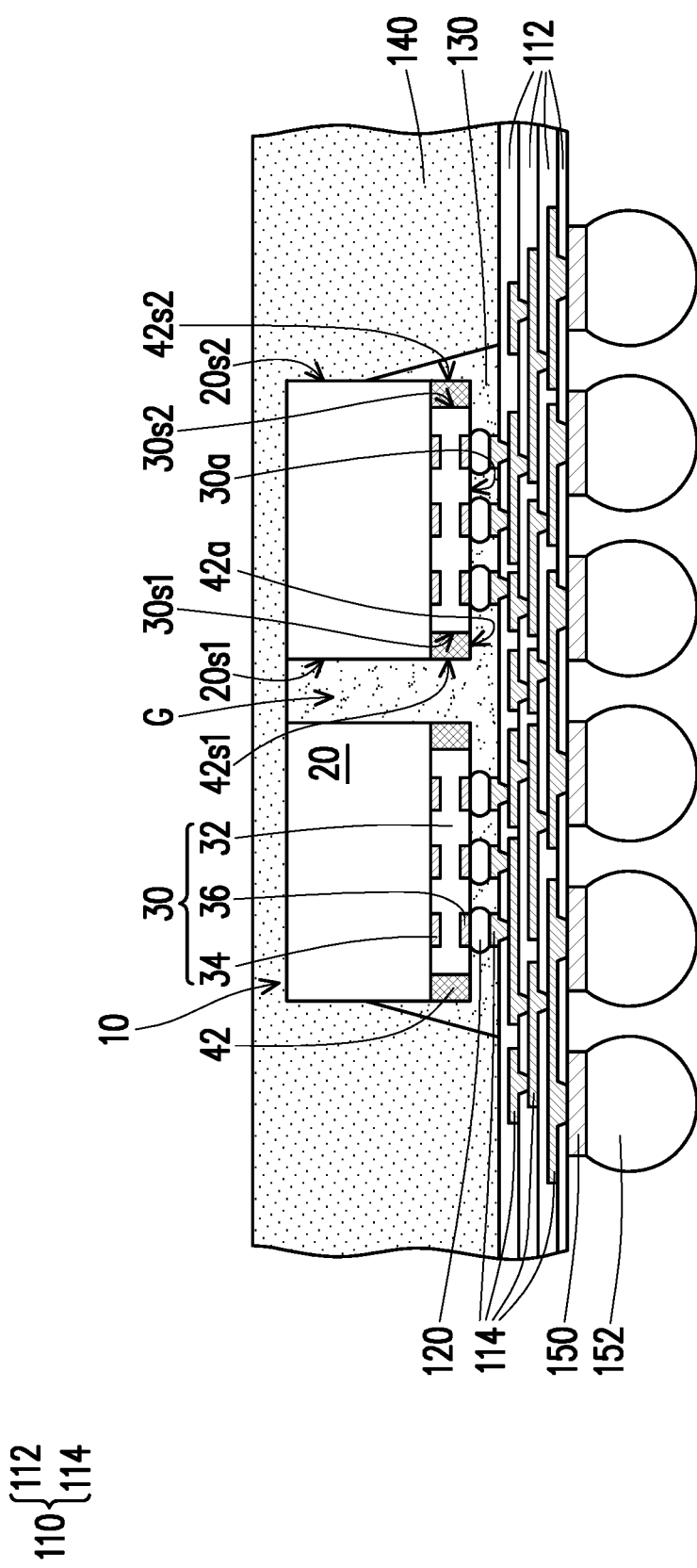

Referring to FIG. 2C, a plurality of conductive pads 150 and a plurality of conductive terminals 152 are sequentially formed on the conductive patterns 114. In some embodiments, the carrier 102 is de-bonded and is separated from the redistribution structure 110. In some embodiments, the de-bonding process includes projecting a light such as a laser light or an UV light on the de-bonding layer 104 (e.g., the LTHC release layer) so that the carrier 102 can be easily removed along with the de-bonding layer 104. During the de-bonding step, a tape (not shown) may be used to secure the structure before de-bonding the carrier 102 and the de-bonding layer 104. After removing the carrier 102 and the de-bonding layer 104, the conductive pads 150 are formed on the conductive patterns 114 respectively. The conductive pads 150 and the packages 10 are disposed at opposite sides of the redistribution structure 110. In some embodiments, the conductive pads 150 and the electrical connectors 120 are disposed at opposite sides of the redistribution structure 110. The conductive pads 150 may be formed for ball mount. In some embodiments, the conductive pads 150 include aluminum, copper, nickel, or an alloy thereof. In some embodiments, the conductive pads 150 may include UBMs.

Then, the conductive terminals 152 may be placed on the conductive pads 150. The conductive terminals 152 may be controlled collapse chip connection (C4) bumps, solder balls such as a ball grid array (BGA), metal pillars, electroless nickel-electroless palladium-immersion gold (ENEPIG) technique formed bumps, or the like. The conductive terminals 152 include a conductive material such as solder, copper, aluminum, gold, nickel, silver, palladium, tin, the like, or combinations thereof. In an embodiment in which the conductive terminals 152 are solder bumps, the conductive terminals 152 are formed by initially forming a layer of solder through various methods such as evaporation, electroplating, printing, solder transfer, ball placement, or the like. In such embodiment, once the layer of solder has been formed, a reflow is performed to shape the material into the desired bump shape. The removal of the carrier 102 and the de-bonding layer 104 and/or formation of the conductive pads 150 and the conductive terminals 152 may be performed while the encapsulant 140 is on a tape.

Figure 2D:
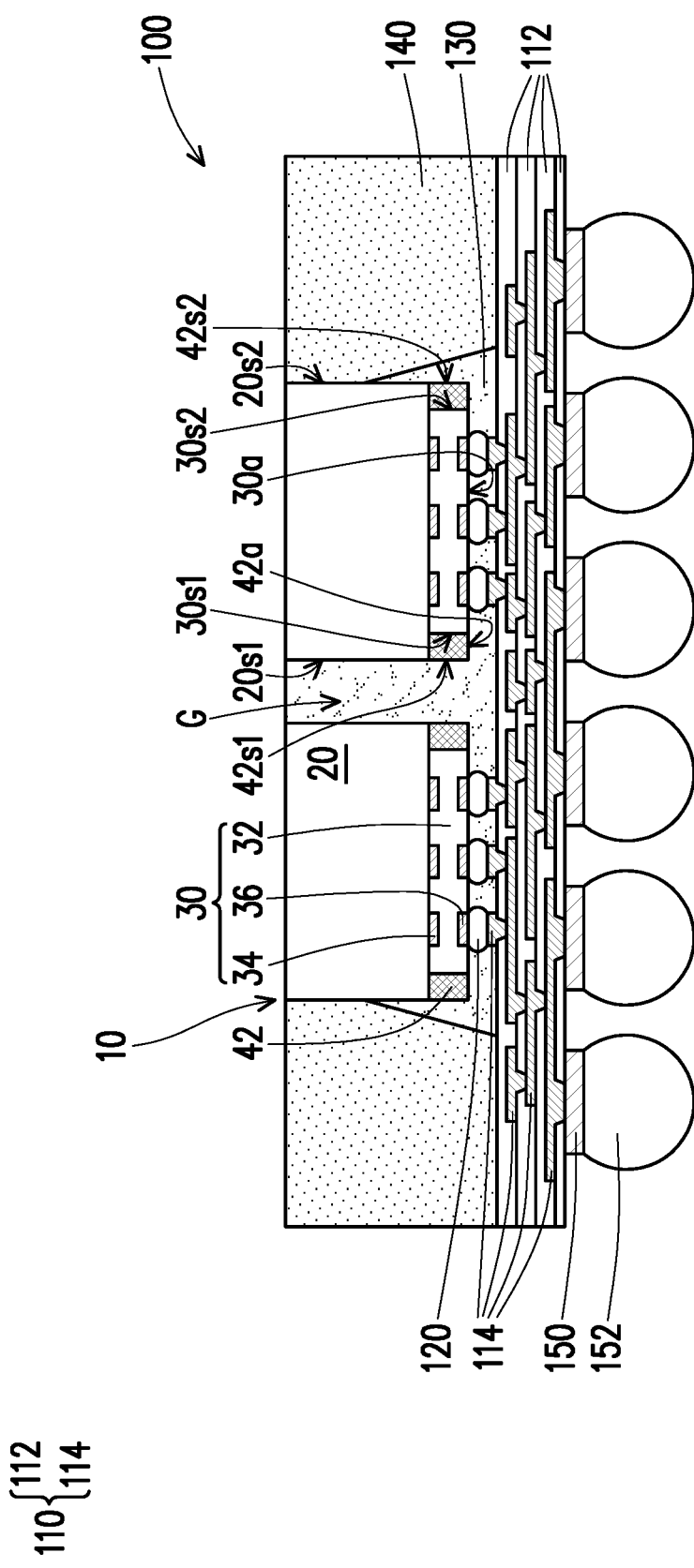

Referring to FIG. 2D, the encapsulant 140 is thinned to expose the top surfaces of the packages 10. The thinning may be accomplished by a CMP, a grinding process, or the like. After the thinning, a top surface of the encapsulant 140 and the top surfaces of the packages 10 may be levelled. In some embodiments, the top surface of the encapsulant 140 is substantially flush with the top surfaces of the packages 10 and the underfill 130. In some embodiments, the redistribution structure 110 and the encapsulant 140 are singulated (not shown) by a singulation process, thereby forming a semiconductor package 100. The singulation may be performed while the redistribution structure 110 is on a tape. Singulation is performed along scribe line regions. In some embodiments, the singulation process includes a sawing process, a laser process, or combinations thereof. As shown in FIG. 2D, as a result of the singulation process, sidewalls of the redistribution structure 110 and the encapsulant 140 are substantially flush with each other. The semiconductor package 100 may integrate homogeneous or heterogeneous components. In some embodiments, the semiconductor package 100 is formed by forming the redistribution structure first, which is also referred to RDL first process. However, the disclosure is not limited thereto.

Figure 2E:
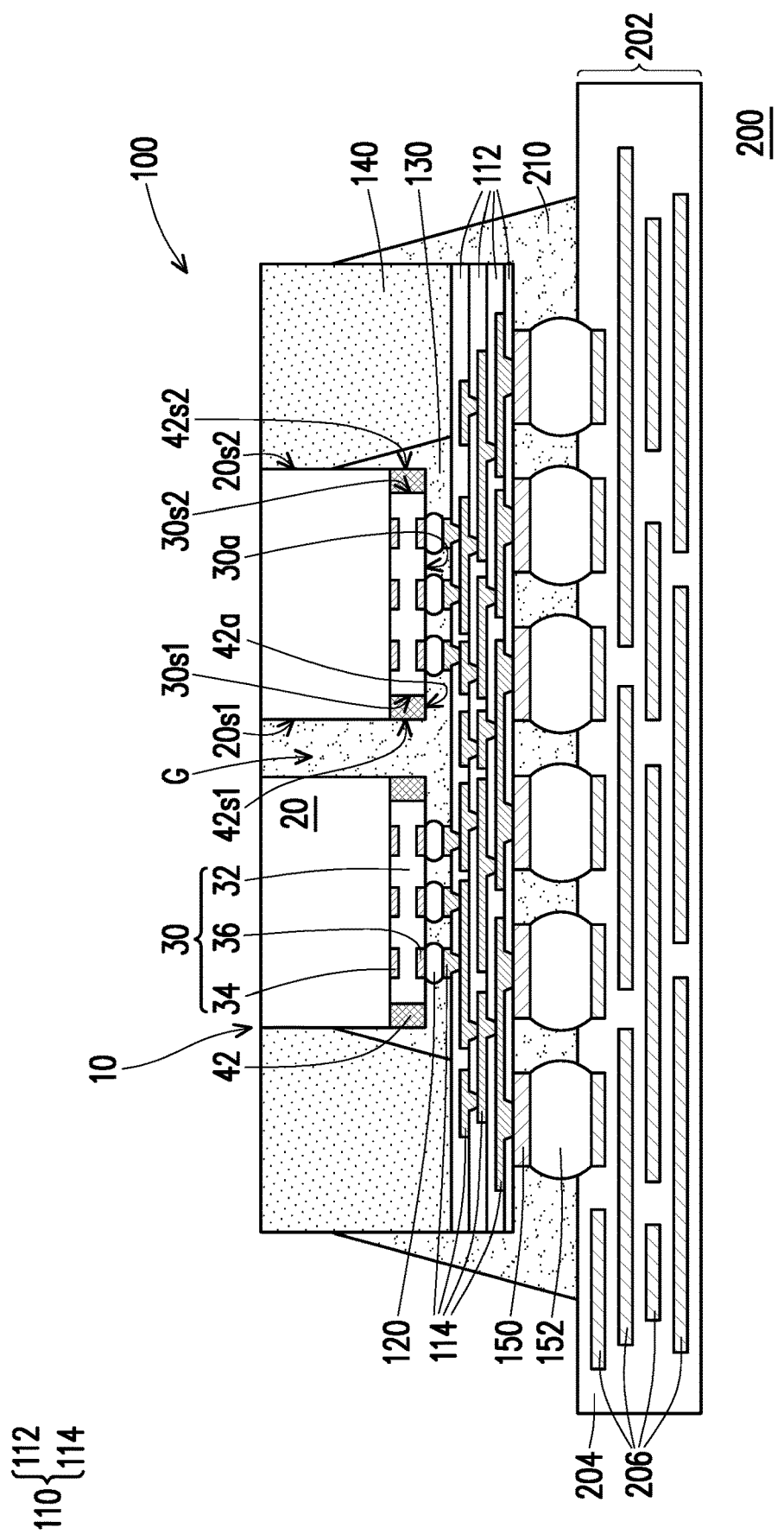

Referring to FIG. 2E, the semiconductor package 100 may be mounted onto a substrate 202, to form a semiconductor package 200. The semiconductor package 200 may be a fan-out package, a super large package and/or suitable for high-performance computing (HPC) application. However, the disclosure is not limited thereto. The substrate 202 may be a package substrate, such as a build-up substrate including multilayer core therein, a laminate substrate including a plurality of laminated dielectric films, a high-layer-count (HLC) substrate, a PCB, or the like. In an embodiment, the substrate 202 includes at least 12 layers. In some embodiments, the effective CTE of the substrate 202 is larger than 14 ppm/° C., which is larger than the CTE (3 ppm/° C.) of silicon. In some embodiments, the substrate 202 is expanded during the heat treatment.

The substrate 202 may include one or more dielectric or polymer layers 204 and respective conductive patterns 206 in the dielectric or polymer layers 204. The conductive patterns 206 may route electrical signals such as by using vias and/or traces. The conductive patterns 206 may include bond pads at the outermost surface of the substrate 202. The substrate 202 may further include electrical connectors (not shown), such as solder balls, to allow the substrate 202 to be mounted to another device. In some embodiments, the conductive terminals 152 are reflowed to attach the semiconductor package 100 to conductive patterns 206 (i.e., bond pads), thereby bonding the semiconductor package 100 to the substrate 202. The conductive terminals 152 electrically and/or physically couple the substrate 202 to the semiconductor package 100. In alternative embodiments, passive devices (e.g., surface mount devices (SMDs), not shown) are attached to the substrate 202 (e.g., by bonding to the bond pads) prior to mounting the semiconductor package 100 on the substrate 202. The passive devices may be bonded to a same surface of the substrate 202 as the conductive terminals 152. In some embodiments, after bonding the semiconductor package 100 onto the substrate 202, an underfill 210 is formed between the semiconductor package 100 and the substrate 202, surrounding the conductive terminals 152. The underfill 210 may be formed by a capillary flow process.

In some embodiments, the gap G is formed between the packages 10 (i.e., between the dies 30), and the buffer layer 42 is formed adjacent to the gap G. For example, as shown in FIGS. 2E and 3, the buffer layer 42 is at least disposed on the sidewall 30$s$1 of the die 30 adjacent to the gap G. In some embodiments, both the packages 10 have the buffer layers 42 on the sidewalls 30$s$1 immediately adjacent to the gap G. In some embodiments, a CTE mismatch is present between the substrate 202 and the dies 20, 30. The CTE mismatch may induce stress concentration at the gap G between the packages 10 (i.e., the gap G between the dies 30), and thus the underfill 130 may be liable to delaminate and the redistribution structure 110 may crack. For heterogeneous integration using large interposer (CoWoS or organic interposer) on a high electrical performance substrate (multi-layer core or more than 12 layers count substrate), the CTE mismatch between substrate and the above devices is more likely to cause underfill delamination and RDL crack at device gap. In some embodiments, by disposing the buffer layer 42 adjacent to the gap G between the packages 10, the stress may be released. Thus, the delamination of the underfill 130, the crack of the redistribution structure 110 and/or the like may be prevented.

Figure 4A:
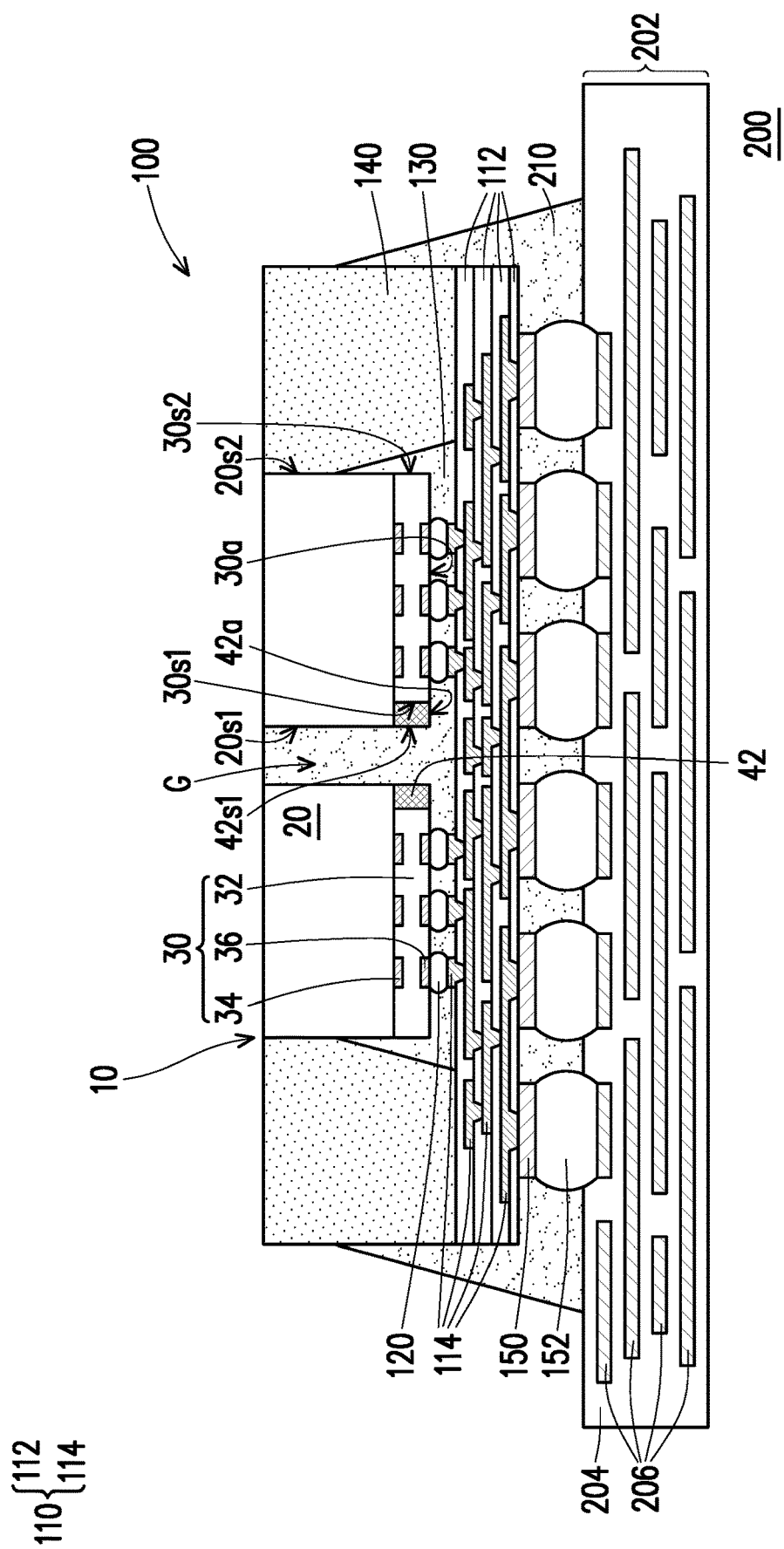
FIGS. 4A and 4B are schematic cross-sectional view and top view of a semiconductor package in accordance with some embodiments.
Figure 4B:
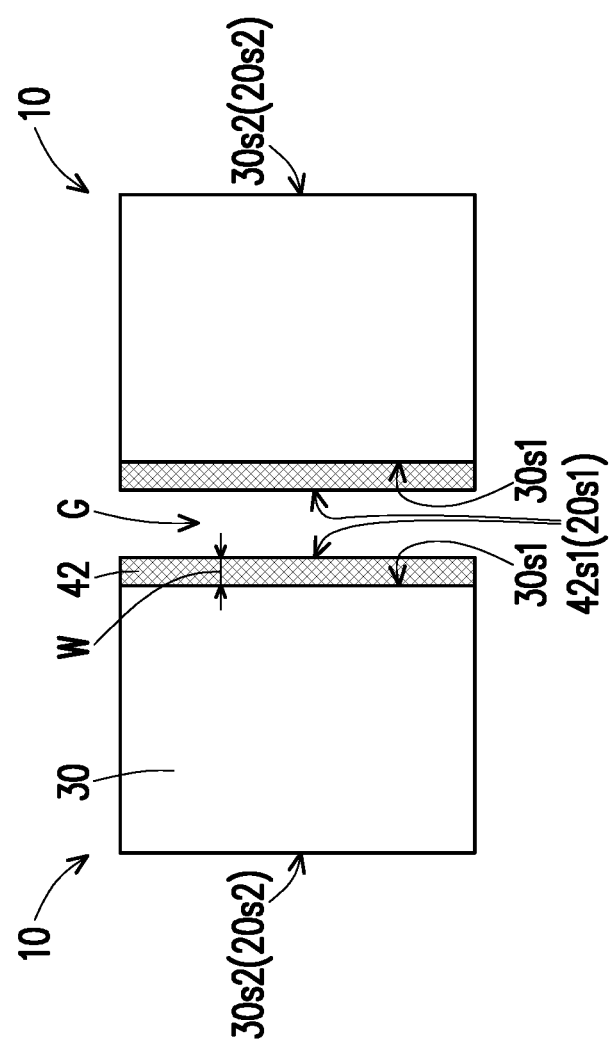
Figure 5A:
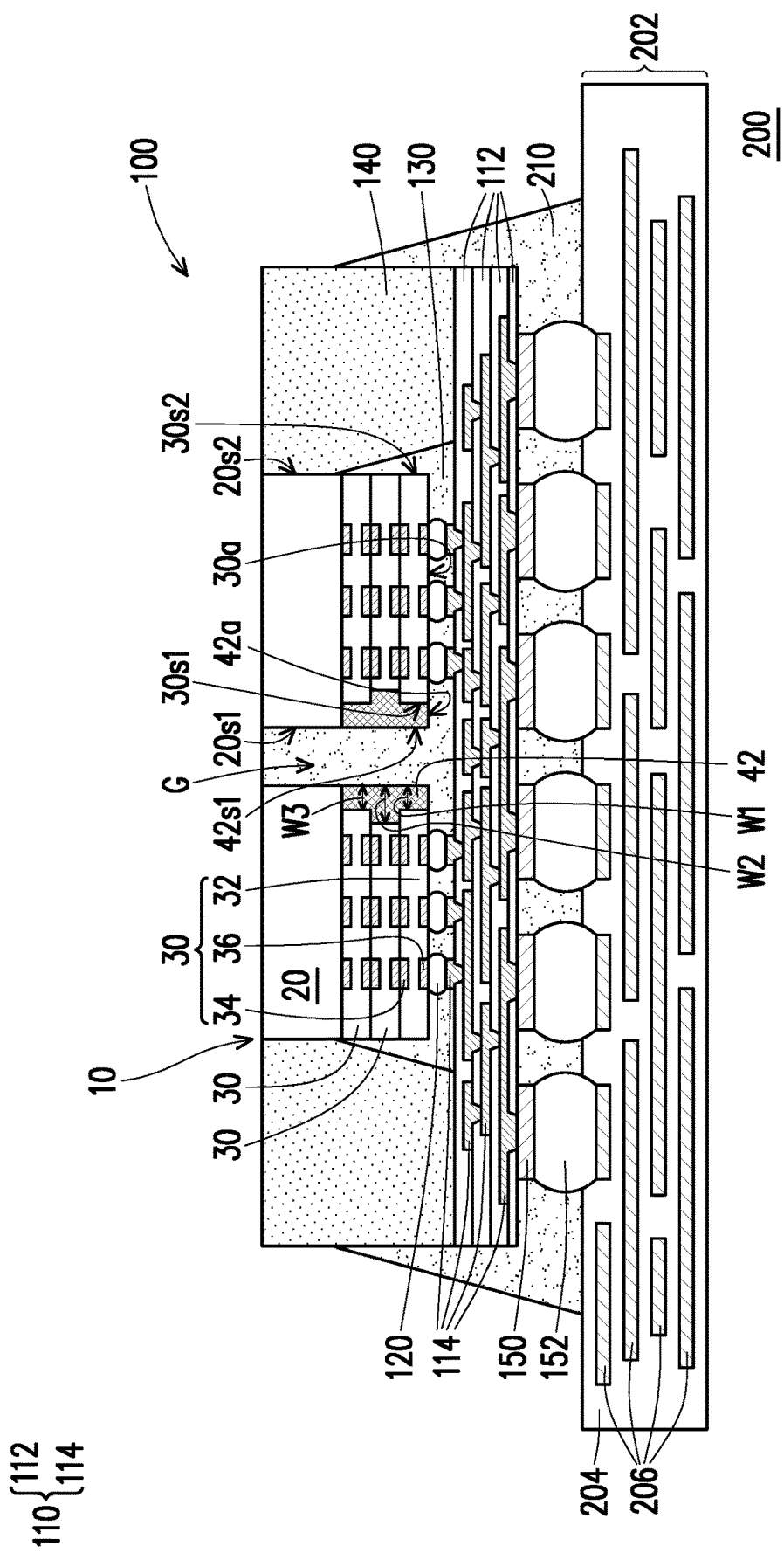

In some embodiments, as shown in FIG. 3, the buffer layer 42 surrounds the die 30 entirely. However, disclosure is not limited thereto. In alternative embodiments, as shown in FIGS. 4A and 4B, the buffer layer 42 is disposed at one sidewall 30$s$1 of the die 30 adjacent to the gap G between the packages 10. In such embodiments, the sidewall 42$s$1 of the buffer layer 42 is substantially flush with the sidewall 20$s$1 of the die 20. The sidewall 20$s$2 of the die 20 may be substantially flush with the sidewall 30$s$2 of the die 30. In alternative embodiments (not shown), the sidewall 20$s$2 of the die 20 is shifted with respect to the sidewall 30$s$2 of the die 30. In an embodiment, the die 20 is a substrate without active devices, such as a silicon substrate, and the die 30 is a SoC. In another embodiment, the die 20 and the die 30 are both SoCs. In alternative embodiments, as shown in the packages 10 of FIGS. 5A and 5B, at least two dies 30 are stacked on the die 20, and the buffer layer 42 is formed on the sidewalls 30$s$1 of the dies 30. In other words, at least one die 30 is disposed between the die 30 (e.g., the bottommost die) and the die 20 (e.g., the uppermost die). The size of the dies 30 is smaller than the size of the die 20. In some embodiments, the buffer layer 42 is continuously formed on the sidewalls 30$s$1 of the dies 30 adjacent to the gap G between the packages 10. The sidewall 42$s$1 of the buffer layer 42 may be substantially flush with the sidewall 20$s$1 of the die 20. In some embodiments, the dies 30 have different sizes, and thus widths W1, W2, W3 of the buffer layer 42 on different dies 30 are different. In alternative embodiments (not shown), the dies 30 have substantially the same size, and the buffer layer 42 on different dies 30 has the same width. In alternative embodiments (not shown), the buffer layer 42 is formed on two, three or four sidewalls of the dies 30, and one of the two, three or four sidewalls of the dies 30 is the sidewall 30$s$1 adjacent to the gap G between the packages 10.

Figure 6A:
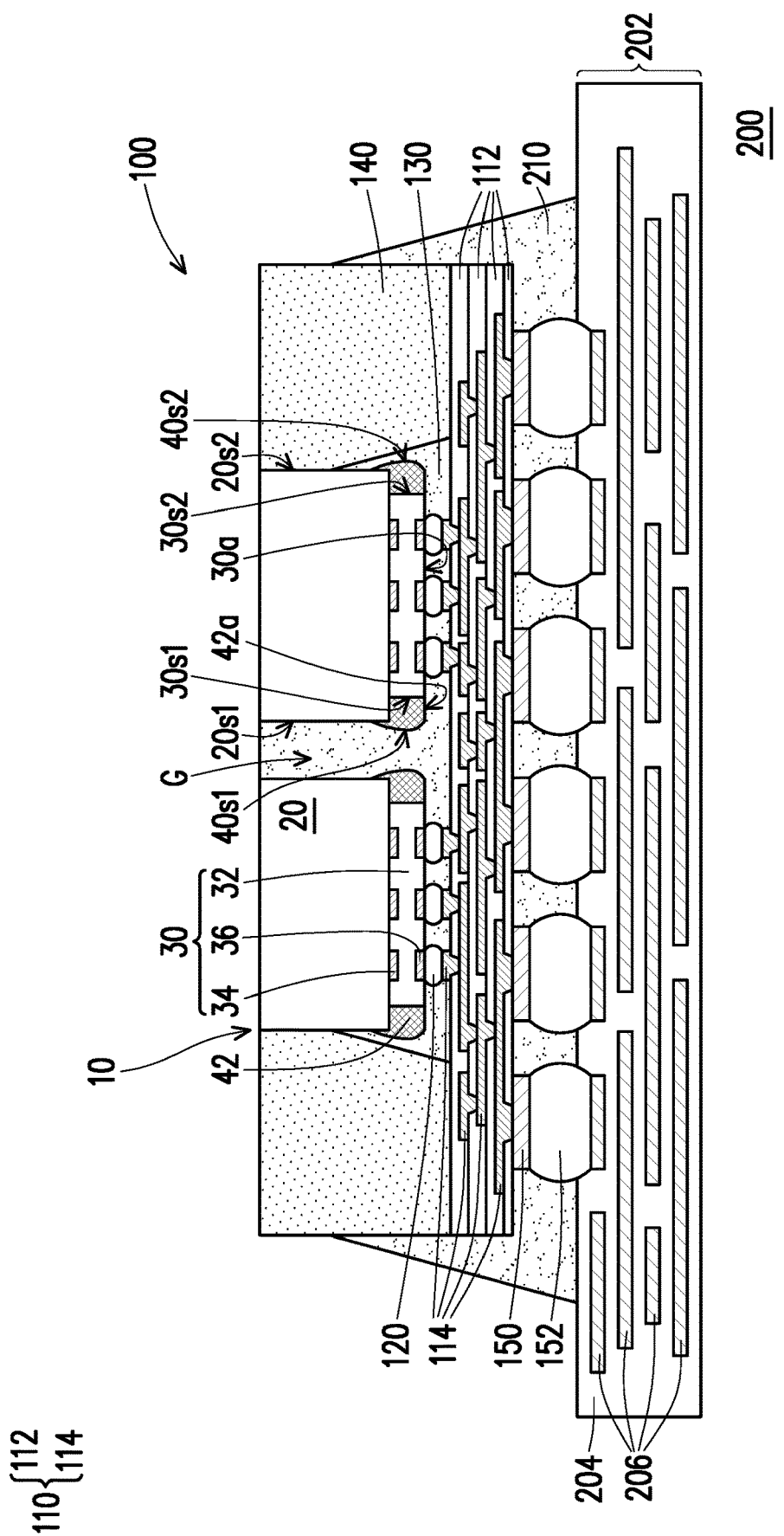
FIGS. 6A and 6B are schematic cross-sectional view and top view of a semiconductor package in accordance with some embodiments.
Figure 6B:
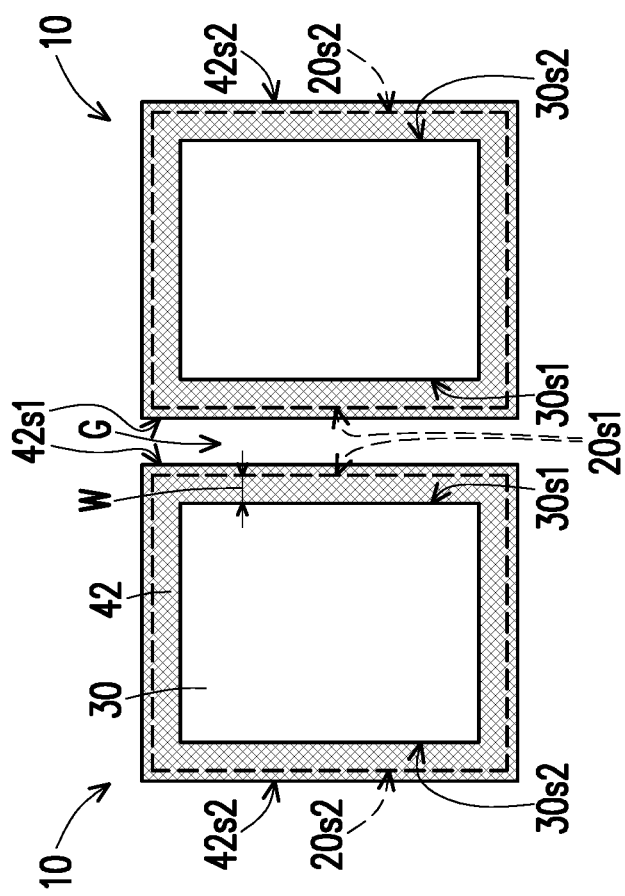
Figure 7A:
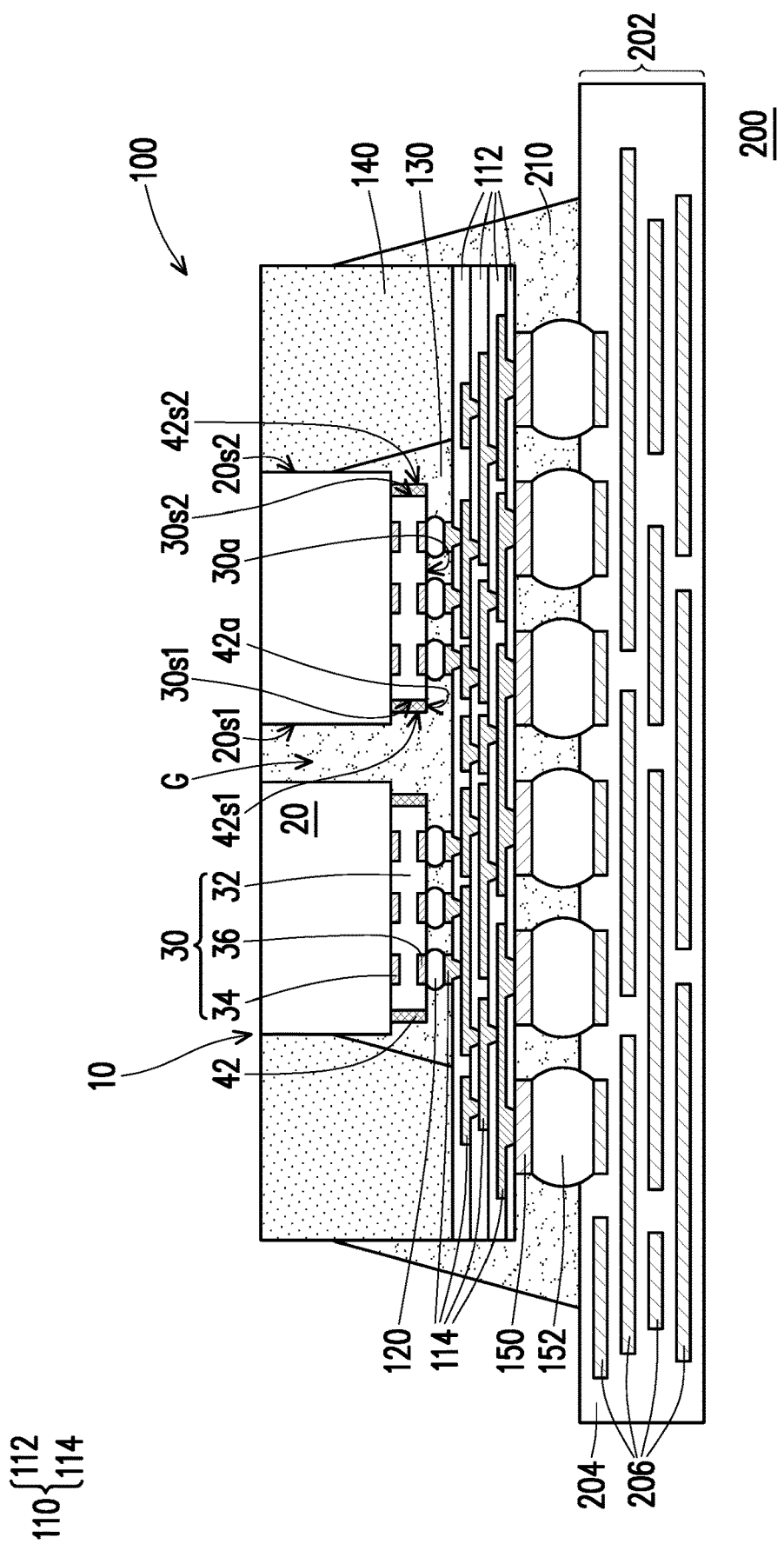
FIGS. 7A and 7B are schematic cross-sectional view and top view of a semiconductor package in accordance with some embodiments.
Figure 7B:
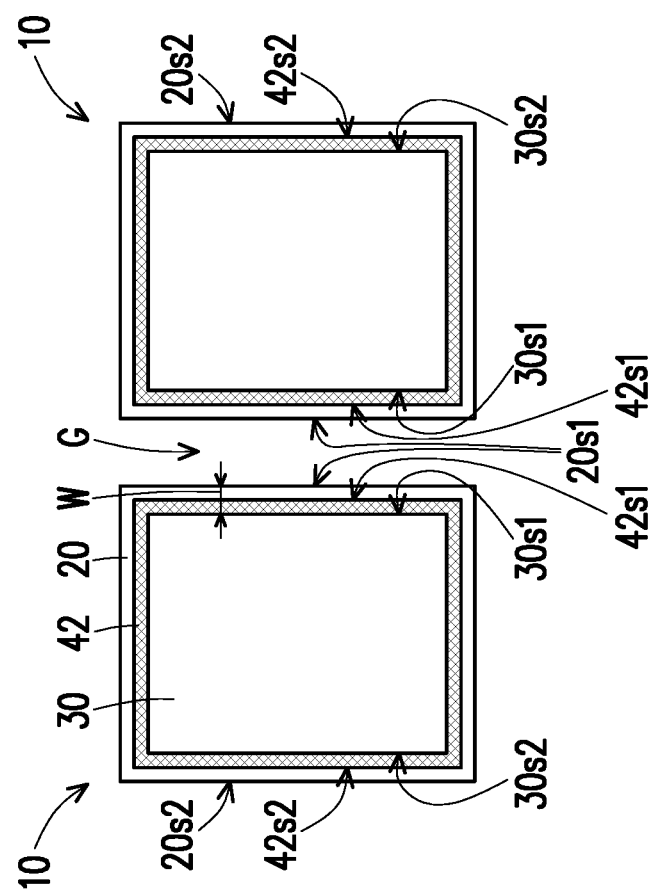

In some embodiments, the sidewall 42$s$1 of the buffer layer 42 is substantially flush with the sidewall 20$s$1 of the die 20. However, the disclosure is not limited thereto. The sidewall 42$s$1 of the buffer layer 42 may be irregular. In alternative embodiments, as shown in FIGS. 6A and 6B, the buffer layer 42 is disposed on at least a portion of the sidewall 20$s$1 of the die 20. In an embodiment (not shown), the buffer layer 42 covers the sidewall 20$s$1 of the die 20 entirely. The buffer layer 42 may disposed at two, three or four sidewalls of the die 20, and one of the two, three or four sidewalls of the die 20 is the sidewall 20s1 adjacent to the gap G between the packages 10. In addition, the buffer layer 42 may be disposed at a portion of the side(s). In alternative embodiments, as shown in FIGS. 7A and 7B, the sidewall 42s1 of the buffer layer 42 is shifted inward with respect to the sidewall 20s1 of the die 20 by a distance. In other words, the sidewall 42s1 of the buffer layer 42 may be not flush with the sidewall 20s1 of the die 20. In alternative embodiments, the buffer layers 42 of adjacent packages 10 are physically connected and in direct contact with each other. The buffer layer 42 may be formed after an individual stack having the die 20 and the die 30 is formed. For example, after the dies 30 are stacked on the dies 20, the singulation process is performed to form a plurality of individual stacks without the buffer layers. Then, the buffer layer 42 is formed on the die 30 of the stack to form the package 10. In some embodiments, the buffer layer 42 is a paste such as epoxy based dam material, an adhesive such as thermally conductive adhesive or the like.

Figure 8A:
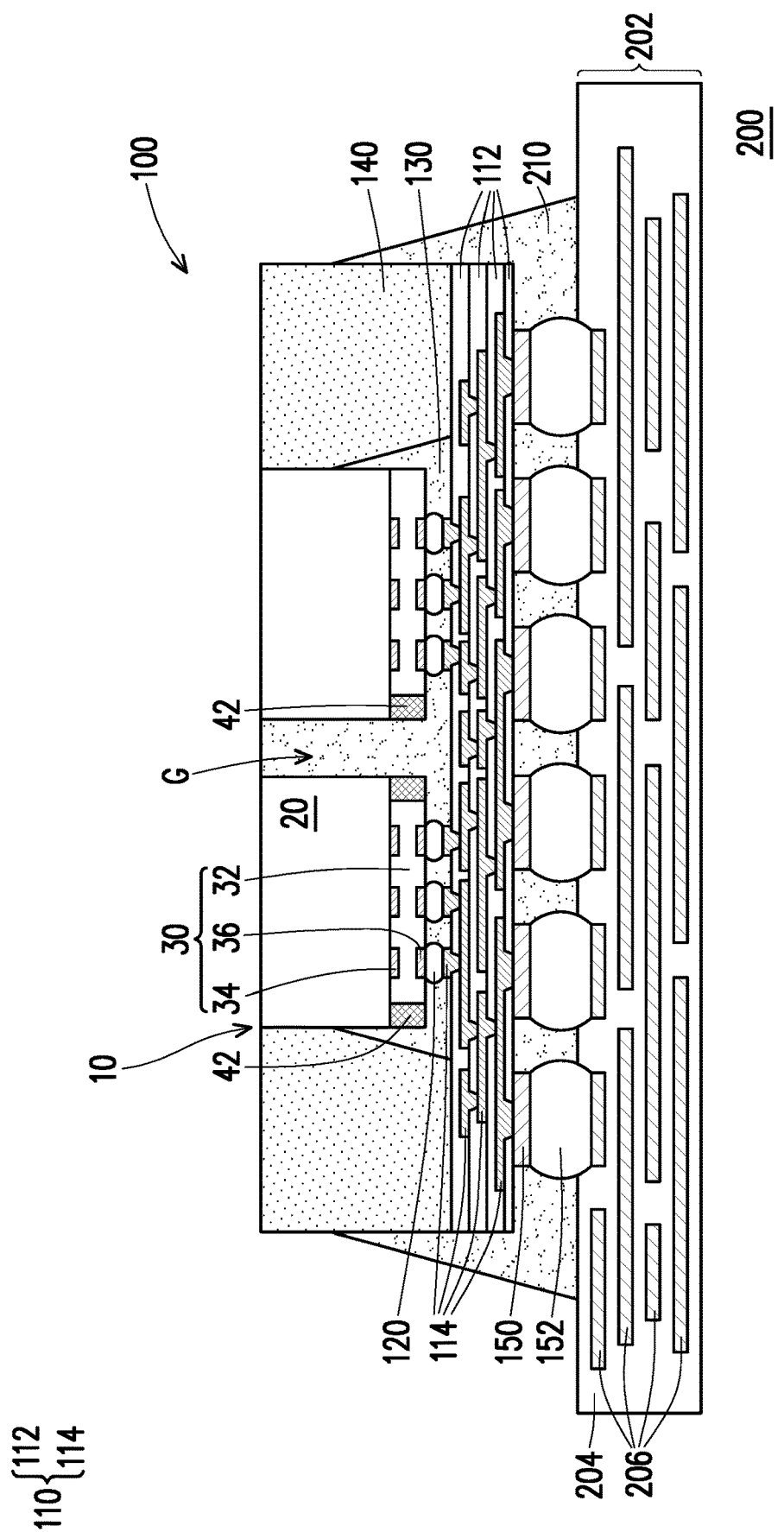
FIGS. 8A and 8B are schematic cross-sectional view and top view of a semiconductor package in accordance with some embodiments.
Figure 8B:
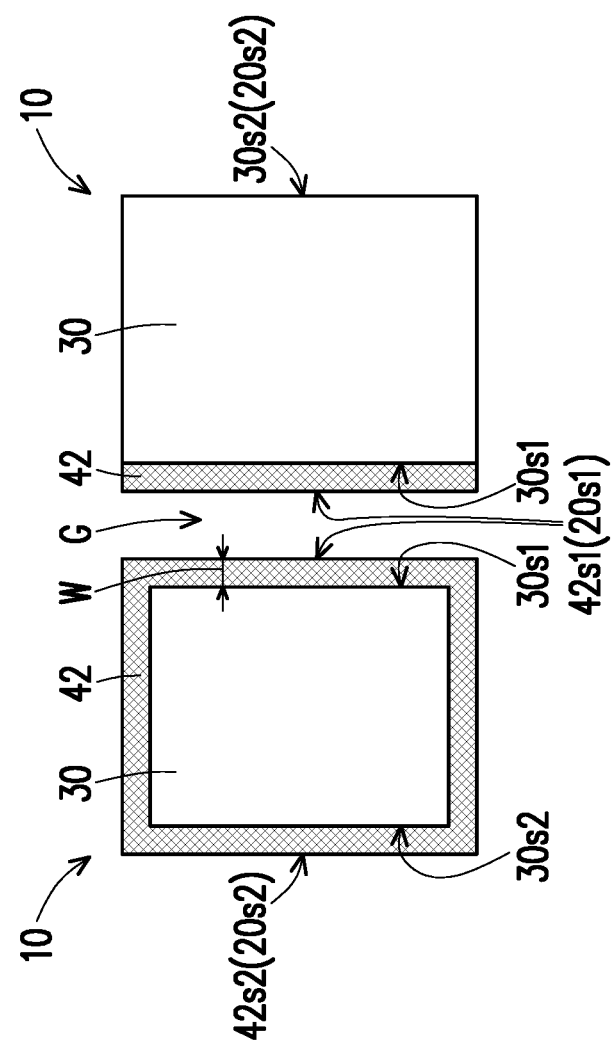
Figure 9A:
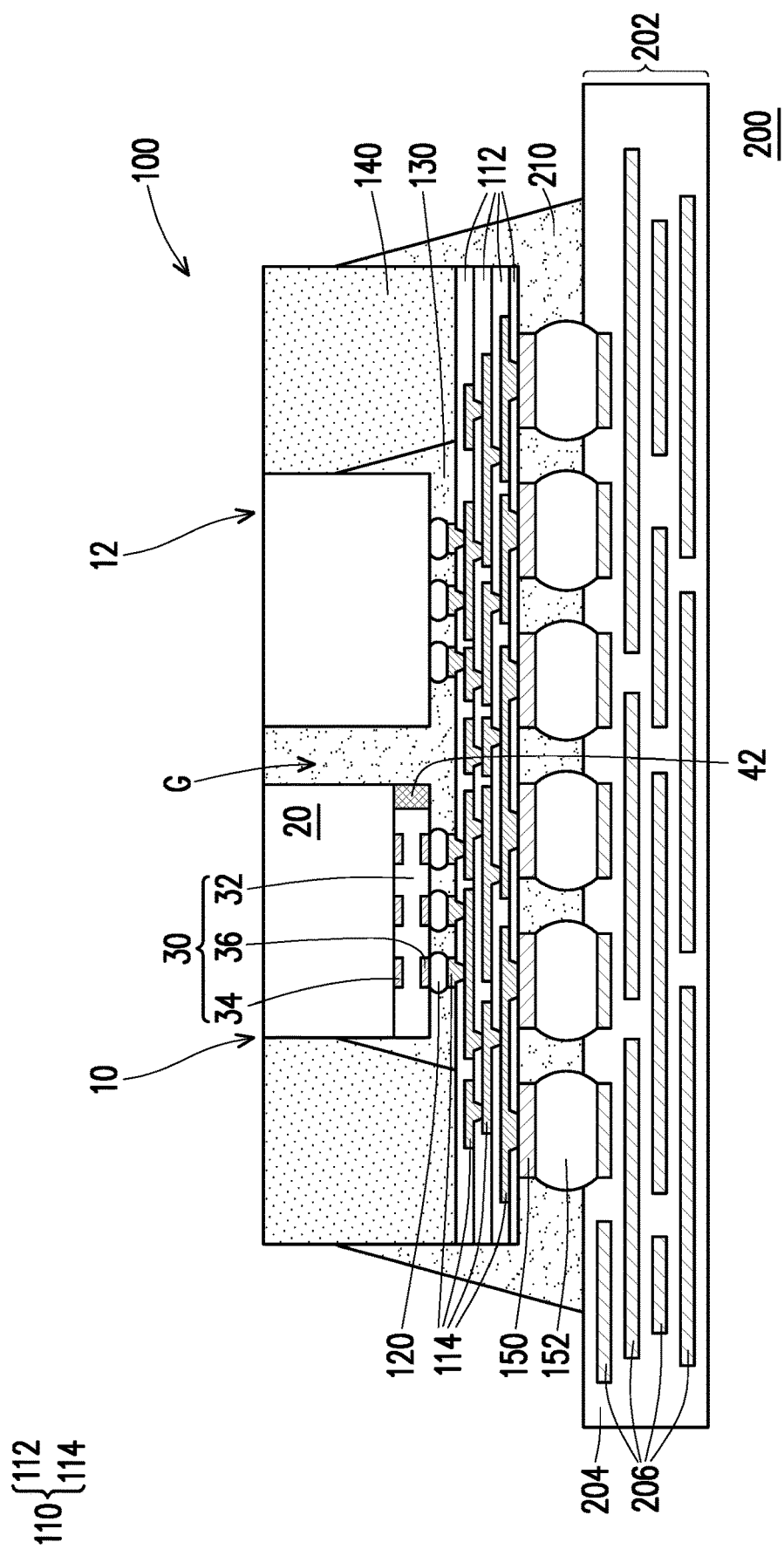

In some embodiments, the buffer layers 42 of the packages 10 have the same configuration, however, the disclosure is not limited thereto. In alternative embodiments, the buffer layers 42 of the packages 10 have different configurations. For example, as shown in the packages 10 of FIGS. 8A and 8B, the buffer layer 42 of one of the packages 10 is disposed at one side of the die 30 adjacent to the gap G while the buffer layer 42 of the other of the packages 10 is disposed at more than one side of the die 30. In some embodiments, the buffer layers 42 are similar to the buffer layers 42 of FIG. 2E and FIG. 4A, respectively. However, the disclosure is not limited thereto. The buffer layers 42 may be selected from the buffer layers 42 of FIGS. 2E, 4A, 5A, 6A and 7A and the like respectively and different from each other. In addition, as shown in the packages 10 of FIGS. 9A and 9B, the package 10 having the buffer layer 42 may be integrated with a package 12 without the buffer layer 42. The package 12 may include a semiconductor substrate, a die(s), a die stack such as a high bandwidth memory (HBM) module or any other suitable package. In some embodiments, the buffer layer 42 of the package 10 is similar to the buffer layer 42 of the package 10 of FIG. 4A. However, the disclosure is not limited thereto. The buffer layer 42 of FIG. 9A may be selected from the buffer layers 42 of FIGS. 2E, 5A, 6A and 7A and the like.

In some embodiments, by forming the buffer layer adjacent to the gap between the packages, the stress due to the CTE mismatch between the package substrate and the die is released. Thus, the delamination of the underfill, the crack of the RDL and/or the like may be prevented. Accordingly, the reliability and/or the structural integrity of the formed semiconductor package may be improved.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a redistribution structure, a first die, a second die and a buffer layer. The second die is disposed between the first die and the redistribution structure, and the second die is electrically connected to the first die and bonded to the redistribution structure. The buffer layer is disposed on a first sidewall of the second die, wherein a second sidewall of the buffer layer is substantially flush with a third sidewall of the first die.

In accordance with some embodiments of the disclosure, a semiconductor package includes a redistribution structure, a first die, a second die, a buffer layer and an underfill. The first die and the second die are stacked on each other, and the second die is bonded to the redistribution structure. The buffer layer is disposed on a first sidewall of the second die and extended onto a first portion of a second sidewall of the first die. The underfill is in contact with the buffer layer and a second portion of the second sidewall of the first die.

In accordance with some embodiments of the disclosure, a semiconductor package includes a redistribution structure, a first package, a second package, a first buffer layer and a second buffer layer. The redistribution structure is bonded to a substrate. The first package includes a first die and a second die and is bonded to the redistribution structure between the first package and the substrate. The second package is bonded to the redistribution structure. The first buffer layer is disposed on a sidewall of the second die. The second buffer layer is disposed on a sidewall of the second package, wherein the first buffer layer and the second buffer layer are disposed between the first package and the second package.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor package, comprising:
   a redistribution structure;
   a first die and a second die between the first die and the redistribution structure, the second die electrically connected to the first die and bonded to the redistribution structure; and
   a buffer layer, disposed on a first sidewall of the second die, wherein a second sidewall opposite to the first sidewall of the second die is exposed by the buffer layer.

2. The semiconductor package according to claim 1, wherein the second sidewall of the second die is flush with a sidewall of the first die.

3. The semiconductor package according to claim 1, wherein the second die comprises a substrate, and a Young's modulus of the buffer layer is smaller than a Young's modulus of the substrate.

4. The semiconductor package according to claim 1 further comprising a third die between the first die and the second die, wherein the buffer layer is further disposed on a sidewall of the third die.

5. The semiconductor package according to claim 4, wherein a width of a portion of the buffer layer on the second die is different from a width of a portion of the buffer layer on the third die.

6. The semiconductor package according to claim 1, wherein a surface of the buffer layer is flush with a surface of the second die.

7. The semiconductor package according to claim 1, wherein a sidewall of the buffer layer is flush with a sidewall of the first die.

8. A semiconductor package, comprising:
a redistribution structure;
a first die and a second die stacked on each other, the second die bonded to the redistribution structure;
a buffer layer, disposed on a first vertical sidewall of the second die and extended onto a first portion of a second vertical sidewall of the first die without extending between the first die and the second die; and
an underfill being in contact with the buffer layer and a second portion of the second vertical sidewall of the first die.

9. The semiconductor package according to claim 8, wherein the buffer layer has a ring-shaped pattern surrounding the second die.

10. The semiconductor package according to claim 8, wherein the buffer layer is further disposed on a third vertical sidewall opposite to the first vertical sidewall of the second die.

11. The semiconductor package according to claim 8, wherein a third vertical sidewall opposite to the first vertical sidewall of the second die is flush with a fourth vertical sidewall opposite to the second vertical sidewall of the first die.

12. The semiconductor package according to claim 8, wherein a Young's modulus of the buffer layer is in a range of 200 MPa to 100 GPa, and coefficient of thermal expansion of the buffer layer is in a range of 0 ppm/° C. to 20 ppm/° C.

13. The semiconductor package according to claim 8 further comprising a third die bonded to the redistribution structure and encapsulated by the underfill partially, wherein the buffer layer is disposed between the second die and the third die.

14. A semiconductor package, comprising:
a redistribution structure bonded to a substrate;
a first package comprising a first die and a second die, bonded to the redistribution structure between the first package and the substrate;
a second package bonded to the redistribution structure, wherein the redistribution structure is a continuous structure disposed continuously under the first package and the second package;
a first buffer layer, disposed on a sidewall of the second die; and
a second buffer layer, disposed on a sidewall of the second package, wherein the first buffer layer and the second buffer layer are disposed between the first package and the second package.

15. The semiconductor package according to claim 14 further comprising an underfill between the first package and the redistribution structure and between the first buffer layer and the second package, wherein the underfill is in direct contact with a sidewall of the first die.

16. The semiconductor package according to claim 14 further comprising an encapsulant encapsulating the first package and the second package, wherein a sidewall of the encapsulant is flush with a sidewall of the redistribution structure.

17. The semiconductor package according to claim 14, wherein the first buffer layer surrounds the first package.

18. The semiconductor package according to claim 14, wherein the first buffer layer is in direct contact with the second die.

19. The semiconductor package according to claim 14, wherein the second package comprises a third die, and the second buffer layer is in direct contact with a sidewall of the third die.

20. The semiconductor package according to claim 14, wherein a sidewall of the first buffer layer is flush with a sidewall of the first die.

\* \* \* \* \*